United States Patent [19]

Hurley

[11] Patent Number: 4,642,564

[45] Date of Patent: Feb. 10, 1987

[54] MEASURING CIRCUIT AND METHOD FOR POWER DISTRIBUTION EQUIPMENT

[75] Inventor: James R. Hurley, Brookfield, Wis.

[73] Assignee: Cooper Industries, Inc., Houston, Tex.

[21] Appl. No.: 620,881

[22] Filed: Jun. 15, 1984

[51] Int. Cl.$^4$ ............................................. G01R 19/02
[52] U.S. Cl. .................................... 324/132; 324/111; 364/483; 364/734
[58] Field of Search ................ 324/132, 111; 364/575, 364/734, 754, 841, 480, 481, 483

[56] References Cited

U.S. PATENT DOCUMENTS

| | | | |
|---|---|---|---|
| 3,488,482 | 1/1970 | Ley | 364/483 |
| 3,822,401 | 7/1974 | Parker | 364/132 |
| 4,193,118 | 3/1980 | Nash et al. | 364/575 X |
| 4,242,638 | 12/1980 | Glaser et al. | 324/132 X |
| 4,245,183 | 1/1981 | Glennon | 324/132 X |
| 4,346,346 | 8/1982 | Silverberg | 364/483 X |
| 4,360,880 | 11/1982 | Brodie et al. | 324/132 X |
| 4,516,008 | 5/1985 | Jones | 324/132 X |

OTHER PUBLICATIONS

Srinivasan, R. et al., "A Programmable Digital Signal Averager", J. Phys. E: Sci. Instrum., vol. 13, No. 12, Dec. 1980, pp. 1263-1265.

Matuoka, M., "A Wide-Range, Digital Power/Energy Meter . . . ", Conference: IAS Annual Mtg. 1980, pp. 838-849.

Depping, F. et al., "Electrical Energy Meter . . . ", Conference: From Electronics to Microelectronics, Fourth European Conf. on Electrotechnics—Eurocon '80.

Sim, L. et al., "A Microcomputer Based Signal Averaging System . . . ", Australasian Physical Sciences in Medicine, vol. 2-6, No. 83, Aug. 1979, pp. 340-345.

Kitas, R. et al., "Digital Instrumentation for the Time Integral of the Square of a Slowly Fluctuating Voltage", IEEE Trans. on Instrum and Meas., vol. 17, No. 3, Sep. 1968, pp. 177-185.

Primary Examiner—Reinhard J. Eisenzopf
Assistant Examiner—Stephen M. Baker
Attorney, Agent, or Firm—Eddie E. Scott; Nelson A. Blish; Alan R. Thiele

[57] ABSTRACT

A measuring circuit for obtaining a mean square value of a power distribution line paramter and a process for obtaining a mean square value is disclosed. The measuring circuit and process exploit my discovery that an accurate measurement of the mean square may be closely approximated by sampling the power parameter an odd number of times greater than one during the power parameter cycle. When the power parameter is sampled an odd number of times (N) during its cycle aliasing errors due to the existence of odd harmonics above the Nyquist Frequency are minimized. As a result, the means of the most recent N sample values squared is very nearly equal to the true mean square value which would be produced by a continuous integration of the square of the power parameter during its period divided by the period. By sampling at a relatively low frequency, errors and circuit complexity are reduced, and the speed with which an acceptable mean square value is obtained is increased.

5 Claims, 6 Drawing Figures

FIG.3

MEASURING CIRCUIT AND METHOD FOR POWER DISTRIBUTION EQUIPMENT

BACKGROUND OF THE INVENTION

This invention relates to circuits and methods for measuring a mean square value of a signal having a known fundamental frequency and a low even harmonic content. This invention particularly relates to providing a mean square value of 60 Hertz current and related parameters in a power distribution line.

Power distribution lines provide alternating current at a frequency which is closely controlled and maintained at 60 Hertz. The generation and distribution line system is such that even harmonics are minimal.

To preserve the ability of a power distribution system to distribute power a number of protective devices are employed. The ability of the power system to distribute power is contingent on a number of factors. A factor of considerable significance is the extent to which the system elements should dissipate energy. A measure of the energy that should be dissipated is provided by the mean square of the current conducted by the system multiplied by the time the system is conducting the current. A plot of a mean square current and time for a protective device to act is known as its time current characteristic. Many types of protective devices measure the value of line current conducted by them and operate to interrupt the line current when it is excessive or faulted. These protective devices may measure the true root mean square value of line current but more often measure an equivalent mean square value. The equivalent means square value may be generated by a peak sensing circuit and applying a form factor. Peak sensing is not considered to be particularly accurate because a single form factor is not appropriate for normal and all fault currents.

Most power distribution lines have three phases and it is desirable to measure line current in each phase and ground to protect the system. Rather than providing four measuring means, one for each phase and ground, the phase and ground sensors can be multiplexed and presented to a single measuring means.

Multiplexing usually requires that a signal be periodically sampled at an appropriate rate to preserve its essential characteristics. It is believed that the parameters for sampling and preserving the essential characteristics were first developed in the communications field. The work of C. E. Shannon and H. Nyquist provide the basic criteria for sampling. In general, Nyquist demonstrated that a sampling frequency which is twice the value of the highest frequency of the sampled signal will preserve the essential characteristic of the sample signal. If the signal to be sampled contains frequency components which are greater than the Nyquist Frequency or half the sampling frequency; not only will information relating to the higher frequencies be lost, but an error affecting the accuracy of the lower frequencies is introduced. These errors are referred to as aliasing errors. In many applications, absolute accuracy of the sampled values is not required. In some cases aliasing error was ignored. In others, a low pass filter was inserted before a sampling means to eliminate higher frequency components of the signal to those no greater than half the sampling rate. This low pass filter compromise also introduces filter errors involving a frequency dependent phase shift and amplitude error. As a result of the existence of aliasing errors and filter errors, devices employing sampling means were generally designed to sample at the highest frequency possible in an attempt to minimize these errors.

Those attempting to measure current and associated parameters in power distribution lines using sampling techniques followed the footsteps of their forerunners in the communication field. The result were circuits of considerable complexity and expense or, significantly flawed measurements.

SUMMARY OF THE INVENTION

I have discovered that measurement of power line distribution currents and associated parameters can be accurately made, if the sampling frequency is an odd harmonic of the fundamental power line frequency. A typical distribution line conducts alternating current in a periodic waveform at a variable magnitude to satisfy the demands, or loads, connected to it. A frequency spectrum of the periodic waveform will typically be: 100% fundamental frequency, 0.5% second harmonic, 5% third harmonic, 0.5% fourth harmonic, and 5% fifth harmonic. The mean square $(RMS)^2$ of a power line parameter is equal to the continuous integration of the square of the parameter during its period divided by the period. The mean square $(RMS)^2$ is also equal to the mean of the sum of the squares of N samples, providing the sampling frequency (FS) is an integral multiple (N) of the fundamental frequency (FF) when the sampling frequency is at least twice as large as the highest frequency component of the power parameter. When one samples at a frequency less than twice the Nyquist frequency aliasing errors result. However, when one examines the magnitude of the aliasing error, it can be shown that an odd number of samples during a period of a periodic waveform minimizes aliasing error arising from odd harmonics above the Nyquist frequency. Similarly, an even number of samples in a period will minimize aliasing error arising from even harmonics above the Nyquist frequency.

As a result of my discovery, I have invented measuring circuits and processes employing a sampling frequencies as low as 180 Hz and 300 Hz, the first two odd harmonics of the standard power line frequency in the United States. The use of my invention does not require a low pass filter and because of the low sampling rate greatly reduces circuit complexity. As a compromise between accuracy and sampling speed, I prefer to sample at the fifth harmonic frequency (300 Hz). The measurement error which results is less than one percent which is completely acceptable for most protective and measuring purposes. In contrast, if sampling were performed at the sixth harmonic frequency, which most would previously have believed to be more accurate, the error resulting is greater than five percent.

Slight mismatch between the sampling frequency (FS) and the fundamental frequency (FF), where the sampling frequency (FS) is not exactly equal to an integral multiple of the fundamental frequency (FF), is not of great moment. For example if the power line frequency varies between 59 and 61 Hertz and the sampling frequency is 180 Hz, the mismatch error is never greater than two percent. The maximum mismatch error decreases to one percent at a sampling frequency of 360 Hz. As N becomes large the error approaches an asymptotic limit of 0.85%. Nor must the sampling bear any particular phase relation to the fundamental power line parameter, since the point at which the parameter is sampled is irrelevant.

My invention implements the process of sampling at an odd (Nth) harmonic of the fundamental frequency, squaring the value of the sample, and determining the mean of the sum of the N most recent squared sample values.

DETAILED DESCRIPTION OF THE DRAWING

Figure 1:
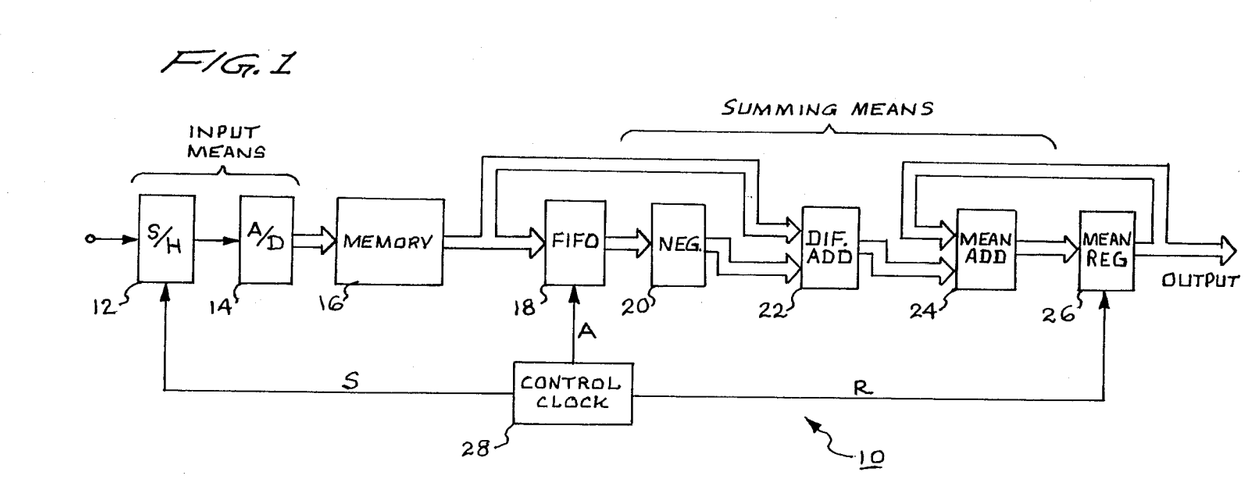
FIG. 1 discloses a measuring circuit of the present invention.

FIG. 1 discloses a measuring circuit 10 which samples the value of a power line parameter and provides the mean of the sum of the squares of N samples to provide a mean square value of the power parameter. A sample and hold circuit 12 samples the power line parameter N times during a cycle where N is odd and larger than 1. The fifth harmonic (N=5) as a sample frequency of the power parameter fundamental frequencies (FF) is preferred as a sample frequency to minimize harmonic error. The value of the power line parameter is held in the sample and hold circuit 12 for a period adequate to allow digital converter 14 to complete digitization of the power parameter sample value. The digitized value of the sample is used to address memory 16.

The memory 16 acts as a squaring means by containing values equal to or nearly equal to the square of the parameter sample. A read only memory is preferred for memory 16. While a square of every parameter value that is likely to be encountered may be stored, an exceptionally large memory would be required. For example, one could store the squares of the values of one to 100 in 100 locations. However, that memory would not respond to fractional increments of the power line parameter. On examination of the use typically made of the power line parameter mean square value for protective purposes one would rapidly recognize that the value of obtaining an exact square for larger values of the power line parameter are non-existent. For example, if the normal load value is normalized at the value of 1 it would be important to determine whether or not that parameter had doubled (was equal to 2) or tripled (equal 3). However, there would be little value in determining whether or not the parameter was 98 or 99 times the value normally present. It is therefore desirable to provide squares of values encountered at the low end of that range at relatively close intervals with increasing intervals between squares toward the upper end of that range. One could, for example, store the squares of 1, 1.25, 1.50, 1.75, 2, 2.5, 3, etc. and towards the upper end of the range store the values of 80, 85, 90 and 100. The values of the squares addressed are finely distinguished at the low end of the range and only grossly indicate the value of the square at the upper end of the range. Values of the power line parameter between 1.375, and 1.625 would result in addressing the square of 1.5. Similarly, values of the parameter between 82.5 and 87.5 would address the square of 85. The use of a lookup table in memory to avoid digital multiplication and the approximation of the values in the lookup table is known for other applications.

In recognizing that a mean of the square values is desired and the square values will ultimately be summed, I have stored 1/Nth of the squared value in memory to avoid division by N after the sum of the squares is formed.

The contents of the memory 16 addressed by the digitized sample value are stored in a first in first out (FIFO) register 18 which acts as accumulator means to store the most recent N values of the squared sample values. As the most recent square sample value is entered into the FIFO register 18, the oldest squared sample value is presented to a negator 20 which negates the oldest square sample value. The negated value of the oldest square and, the newest square are presented to a differential adder 22 to produce a differential squared value of the difference between them. This binary subtraction may be accomplished by a one's or two's complement routine well known in the digital processing field. The differential squared value produced by the differential adder 22 is presented to mean square adder 24 with the existing value of the mean square which is then stored in mean square register 26. Mean square adder 24 adds these values to produce a new mean square value which is then stored in mean square register 26. Negator 20, differential adder 22, mean square adder 24, and mean square register 26 cooperate to act as summing means to provide a mean square value of the sum of the N most recent squares of the sample value. While it is desirable to store 1/Nth the value of the square of the sample values in memory means 16 as above described, one could alternately avoid forming the mean of the N samples involving a division by N, by storing full value of the squares of the samples and maintaining the sum of the square values which would be N times the mean square value. This sum of the squares value being proportional to the mean square value could be used if a scaling adjustment were elsewhere made.

Control clock 28 regulates the exchange of the information among the components of measuring circuit 10 by cyclically generating timing impulses properly spaced in time. A "S" pulse triggers the sample and hold circuit to present a new analog voltage to the analog to digital converter 14. After an interval sufficient to allow the transients associated with the sample and holding process to dissipate, a "R" pulse is generated by control clock 28 which allows the mean square register 26 to accept a new value from mean square adder 24. Thereafter an "A" pulse is issued from control clock 28 allowing the FIFO register 18 to be updated.

Figure 2:
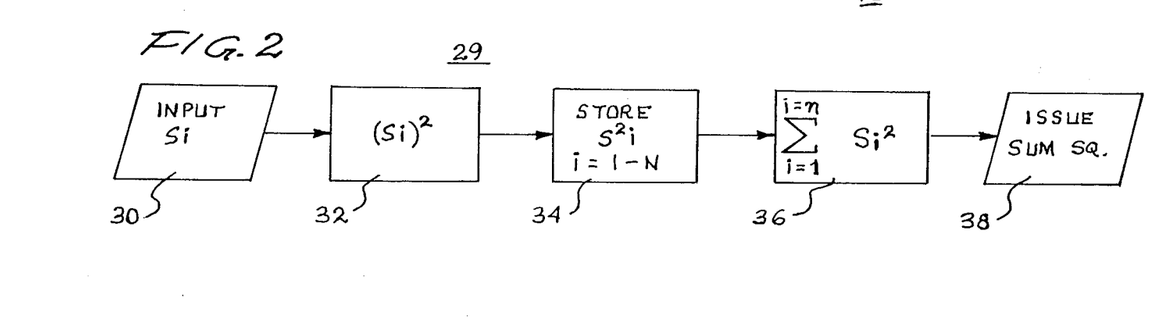
FIG. 2 is a flowchart of a process employed by a measuring circuit to arrive at a mean square value.

FIG. 2 symbolically illustrates a process employed by the measuring circuit 10 in a sampling flowchart 29. A sample value $S_i$ is first provided in input frame 30. Next the square of the sample value is formed in squaring block 32, thereafter the squared sample value is stored with the next four most recent squared sample values in store block 34. Periodically the squared sample values are added in sum block 36 to produce a sum of the squares (SUMSQ). Ultimately the value of SUMSQ is issued in issue frame 38. The value of SUMSQ may then be displayed on display means to give an indication of the mean square value of the power line parameter. More often, the SUMSQ value would be further modified to display a root mean square by taking the square root of that value. Or the SUMSQ value would be used in additional processes to determine whether a protective device should operate.

Figure 3:
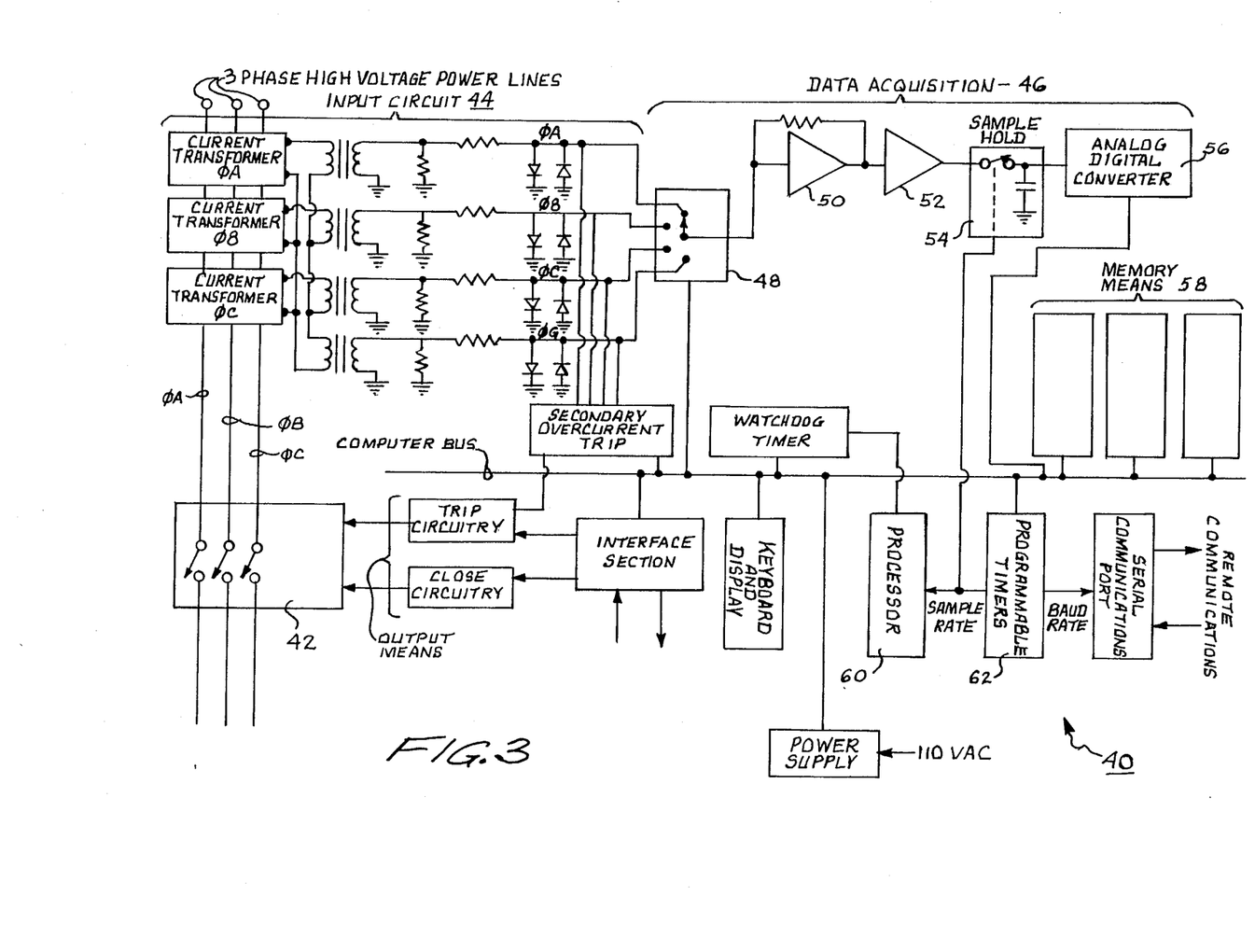
FIG. 3 discloses a microprocessor based recloser control employing my invention.

An example of a protective device employing the process of my invention is disclosed in FIG. 3. FIG. 3 is a block diagram of a microprocessor based recloser control 40. Further details of the operation and circuitry of recloser control 40 are disclosed in co-pending U.S. patent application Ser. No. 303,626 filed on Sept. 18, 1981, now U.S. Pat. No. 4,535,409, of which I am an inventor. That application, in its entirety, is hereby incorporated by this reference into this application. Recloser control 40 uses the SUMSQ value of the current found by the process of my invention to determine if the current is greater than that normally expected in a power distribution line. If the SUMSQ value of current is greater than that expected and therefor exceeds a minimum trip value, the SUMSQ values are updated and used to determine whether or not a time current characteristic curve has been exceeded. If fault values of the current exist for sufficient duration to exceed the time current characteristics recloser 42 is opened to interrupt the fault current. As is readily apparent, recloser control 40 is a considerably more sophisticated device than that disclosed in measuring circuit 10.

Recloser control 40 monitors the current value in each phase and ground of a power distribution line by means of input circuit 44. Input circuit 44 provides analog signals for each phase and ground to data acquisition circuit 46. Data acquisition circuit 46 includes a multiplexer 48, a summing amplifier 50, normalizing scaling amplifier 52, a sample and hold circuit 54, and an analog to digital converter 56. Multiplexer 48 cyclically transmits the analog values of each phase and ground to summing amplifier 50. The multiplexing frequency is 1200 hertz. Summing amplifier 50 is present to take advantage of the virtual ground provided at its input for circuit isolation. Normalizing scaling amplifier 52 normalizes the value of each phase and ground against a preselected normalizing reference. The normalized analog reference produced by normalizing scaling amplifier 52 is presented to sample and hold circuit 54 where it is also sampled at a frequency of 1200 hertz. Analog to digital converter 56 digitizes the output of sample and hold circuit 55. The digitized normalized sample values or their equivalents are stored in memory means 58. The operation of this portion of recloser control 40 is similar to the operation of measuring circuit 10 as previously described. Each employs a sample and hold circuit, an analog to digital converter and a memory. However, storage of the sample values or their corresponding squared values for each phase and ground must be separately processed. Processor means 60 regulates the flow of data in memory means 58 and appropriately manipulates the data to carry out the basic purpose of recloser control 40 which is to protect the power distribution line. Programmable timer 62 in cooperation with processor means 60 is analgous to the control clock 28 shown in FIG. 1. However, recloser control 40 manipulates the data in memory means 58 under the control of processor means 60 to achieve the calculation of mean square equivalent in software rather than in hardware as shown in FIG. 1. The manipulative processes followed may be the same as those described in association with the measuring circuit 10 or their equivalents.

Figure 4:
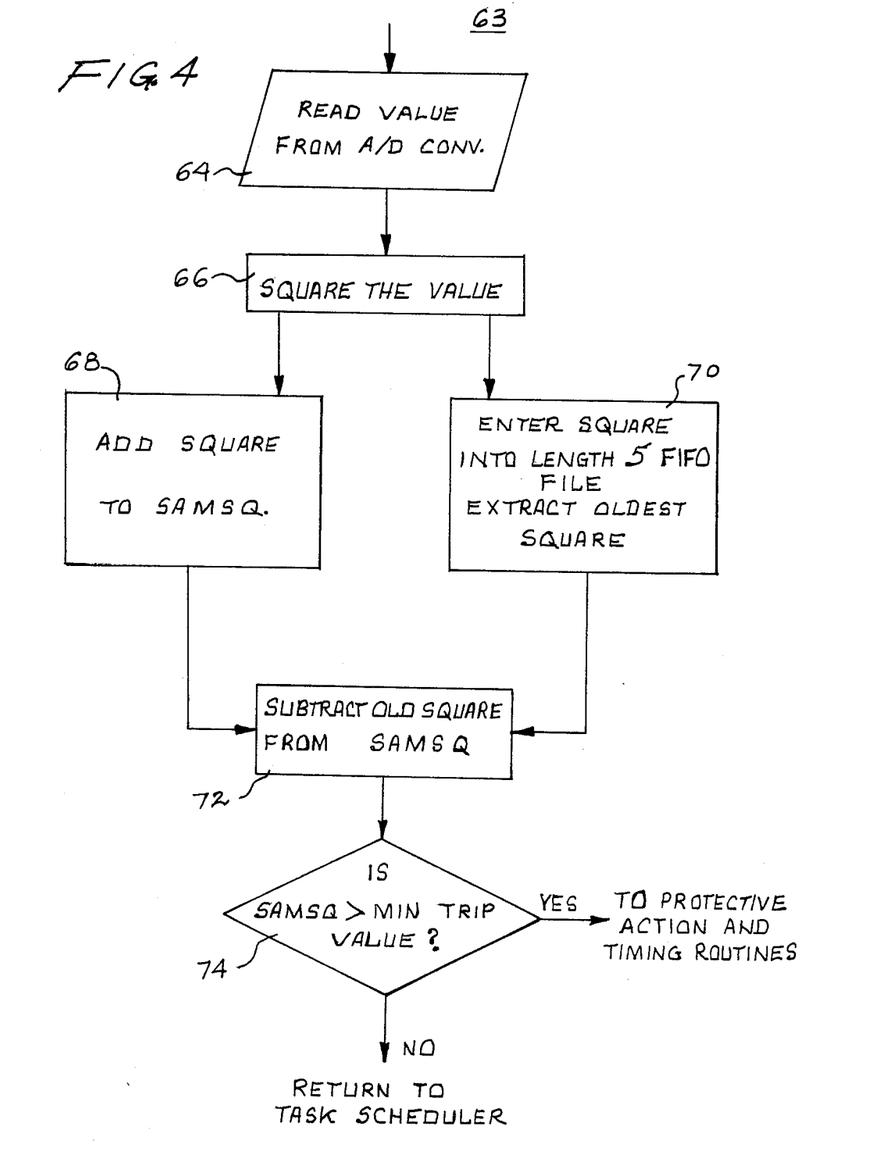
FIG. 4 is a flowchart of a process of my invention employed in a recloser control.

FIG. 4 illustrates an equivalent process for calculating the sum of the squares of the samples in a SAMSQ flowchart 63 which is particularly adapted for overcurrent detection. In read frame 65 a new sample value is read from the A/D converter 56. Processor means 60, next squares the sample value as shown in square block 66. Thereafter the squared sample value is added by processor means 60 to an old value of SAMSQ maintained in memory means 58 in add block 68 to form an intermediate sample square sum (ISAMSQ). The square of the sample value is also entered into a length five FIFO file and the oldest square sample value is extracted in file block 70. The oldest square sample value is then subtracted from the ISAMSQ formed in adder block 68 to produce the present SUMSQ in subtract block 72. Thereafter, the processor 60 tests the value of SAMSQ against a minimum trip value in mimimum trip decision diamond 74. In the event the upscaled minimum trip value has been exceed by the value of the sum of the square various protective actions are begun and the processor 60 determines whether or not the time current characteristic is exceeded as the fault continues. In the event that the new SUMSQ value is less than minimum trip, processor means 60 proceeds to a task scheduler which interweaves other routines among the sampling processes. It should be understood that the flowchart illustrated in FIG. 4 is a equivalent of the process described in association with measuring circuit 10. It is more desirable, for the reasons earlier stated, to store square values over the sampling range and employ those values by addressing them with the output of the analog digital converter to avoid the squaring process.

Figure 5:
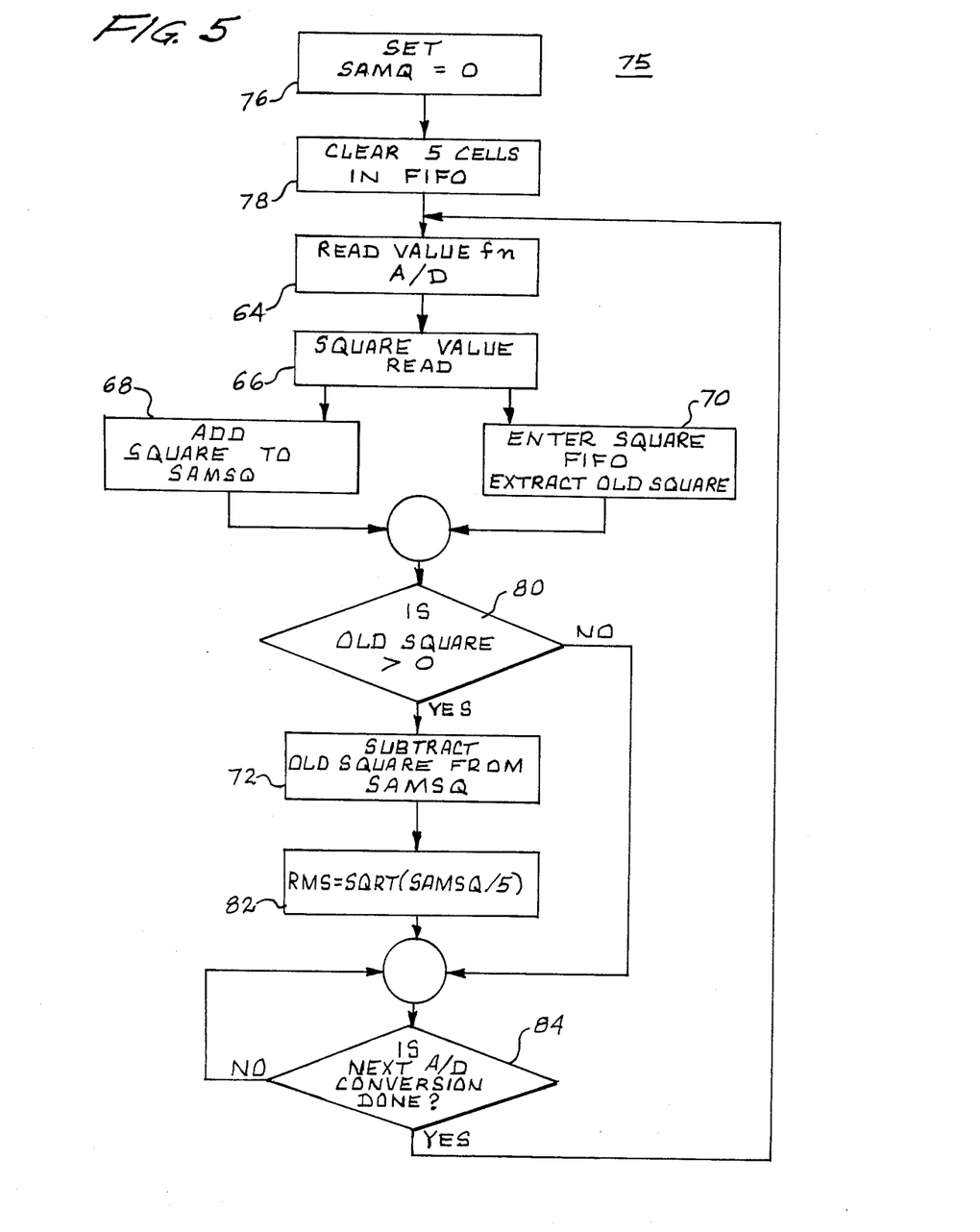
FIG. 5 discloses a flowchart of a process of my invention used to obtain a root mean square value of a power line parameter.

FIG. 5 is an illustration of a RMS process 75 employed by the processor means 60 to provide accurate measurements of the root mean square value of current. In this RMS flow chart 75, initialization of the process is additionally illustrated. The SUMSQ file is initially set equal to zero in zeroing block 76. In clearance block 78 the contents of the length five FIFO file are also zeroed. Thereafter, the steps employed by processing means 60 are very similar to those previously explained in connection with FIG. 4. The differences relate to the initialization process and the use of SAMSQ to form the root mean square of the current. After the new square of the sample is entered into the FIFO file and the oldest square extracted in file block 70, a zero test is performed on the oldest square extracted in zero test decision diamond 80. If the oldest square extracted has a value greater than zero, five samples have accumulated in the FIFO file and the subtraction step is performed in subtract block 72. In the event the oldest square value extracted is zero, five samples have not accumulated and the program skips to a point which initiates obtaining a new sample.

After a new sum square is formed in subtract block 72. The root mean square value is calculated in a RMS block 82 by dividing SAMSQ by five, the number of samples and taking the square root of the resulting mean square. This value is maintained in a RMS file in memory means 58. As desired, it can be read on a display. Following the calculations of the root means square value of the current in RMS block 82, processor means 60 determines whether or not the next analog digital conversion for the phase is complete in conversion diamond 84. If a conversion is completed, the program loops back to read block 64. If the conversion for this phase is not completed, the program idles by looping back to the entry into conversion diamond 84 until the conversion is complete.

Figure 6:
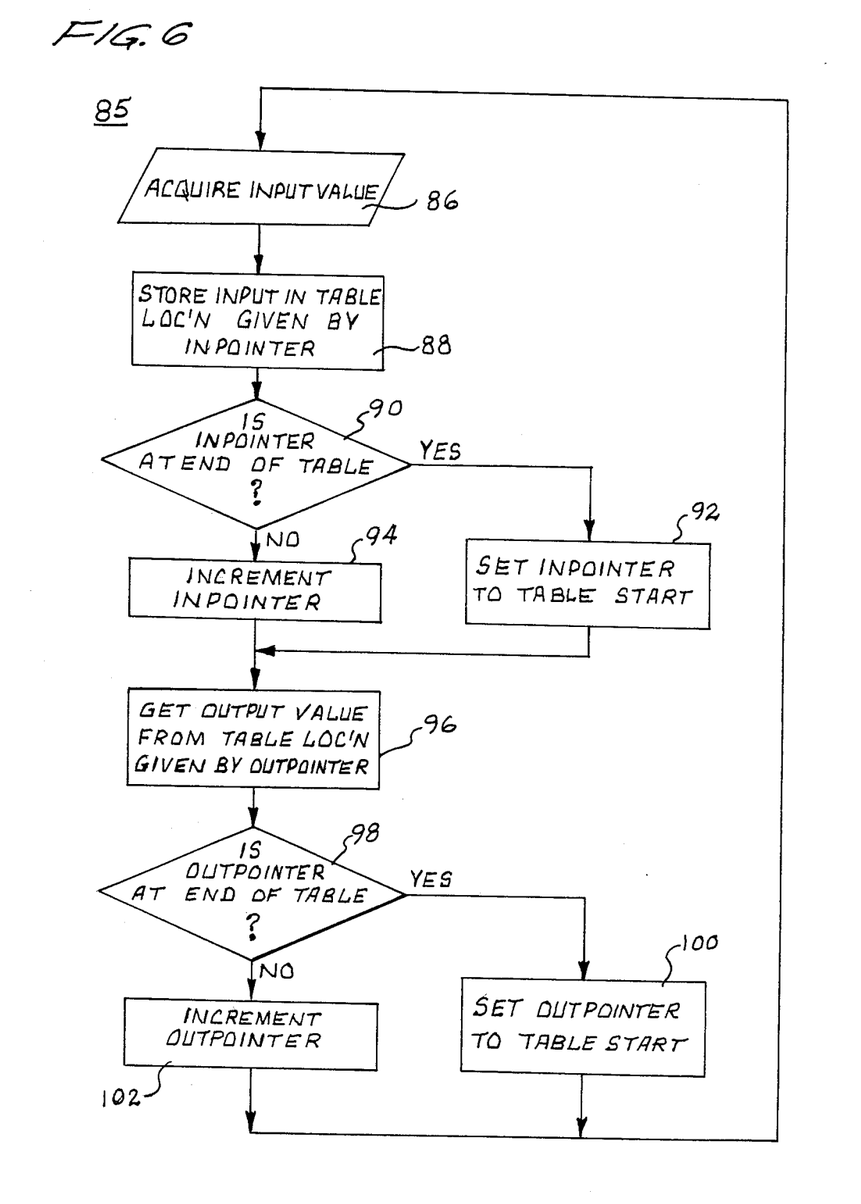
FIG. 6 discloses a flowchart of a process used to convert a portion of a general memory to the equivalent of a first in first out register.

Creation of a N contents first in first out register may be simulated in software by adroit use of inpointers and outpointers used in association with the process of reading and writing into memory means 58 to create a FIFO file. The FIFO flowchart 85 illustrating a creation of a FIFO file is illustrated in FIG. 6. The FIFO file equivalent to the FIFO register 18 created in memory means 58 preferably contains at least 20 and more preferably about 40 elements rather than just five elements. This larger FIFO interlaces the sample values from all phases and ground to further reduce the burden on computation time imposed by looping back to the first entry in the FIFO file. A sample value is acquired in acquisition frame 86. The acquired sample value is then stored in the FIFO file location given by the inpointer memory means 58 in inpointer block 88. Next, the inpointer location is tested to see whether or not it is at the end of the FIFO file in an inend diamond 90. If the inpointer is at the end of the FIFO file, it is initialized to the beginning of the FIFO file in initialization block 92. If the inpointer is not at the end of the FIFO file in inend diamond 90, the inpointer is incremented by one in increment block 94. Thereafter the output value in the FIFO file location indicated by the outpointer is read in read block 96. Next, the outpointer location is tested to see whether or not it is at the end of the FIFO file in outend diamond 98. If it is, the outpointer is returned to the first location in the FIFO file in outinitialization block 100. If the outpointer is not at the end of the table as determined in outend diamond 98, it is incremented by one in outincrement block 102. In either case the program loops back on itself to acquire a new sample value in acquisition frame 86 after the A to D converter 56 has completed the conversion of the sample for the phase involved.

My previously described invention provides a rapid and economic device and process for determining the mean square value for a power line parameter useful in a power line distribution equipment under most conditions. However, when exceptionally high values of fault current exist in a protective device, it is desirable to shorten the time required for the protective device to respond. In order to speed up response, a fast FIFO register or file capable of accepting only two square sample values and, a fast sum square (SAMSQ) register or file are used in parallel with the SAMSQ circuitry and processes. The fast SAMSQ value is formed from the square of the two most recently acquired sample values normally stored whether or not they are divided by N and compared against an instantaneous trip value. If the fast SAMSQ value exceeds the instantaneous trip value, processor means 60 causes recloser 42 to trip.

Because no attempt is made to maintain a fixed phase relationship between the sampling frequency (FS) and the fundamental frequency (FF), the point in the periodic waveform which is sampled is uncertain. As a result, a comparator value which can be used to determine an overcurrent condition is not only influenced by distribution constraints, but also by probablistic considerations. If a simple condition is conducting a normalized root means square (RMS) value of one, a comparator value of 2.618 will almost never be exceeded by the sum of the squares of the two most recent samples. However, the comparator value is set at 2.395 it will always be exceeded by the same unit RMS current.

When the return phase for the unit RMS current is also monitored, a comparative value of 2.487 will always be exceeded by a unit RMS current, when the sum of the squares from both conductors are presented to a comparator function by means of a logic 'or' function.

It should be understood that various modifications, changes and variations may be made in the arrangement, operation and details of construction of the elements herein without departing from the spirit and scope of this invention.

What is claimed is:

1. A measuring circuit for obtaining a mean square value of a power distribution line parameter comprising:

a sampling circuit, which samples the power parameter at a sampling frequency (FS) which is an odd (Nth) harmonic of the fundamental frequency (FF) of the power parameter to provide sample values;

squaring means producing a squared sample value proportional to the squared value of a sample;

accumulator means storing the values of the most recent N values of the squared sample values;

summing means which provides a mean square value proportional to the sum of the N most recent values of the squared sample values stored in the accumulator means;

an analog to digital converter for digitizing the sample values and, wherein said squaring means comprises a squared memory which stores digitized value substantially equal to one/Nth the values of the square of the sample values likely to be encountered, said memory being selectively addressed by the digitized sample value to produce a squared sample value which is very nearly equal to one/Nth the value of the square of the sample value;

said accumulator means comprises:

a first in first out storage register which stores N squared sample values accepting a newest squared sample value at its input and presenting the oldest squared sample value at its output; and said summing means comprises, a negator accepting the oldest squared sample value from said first in first out storage register and negating the value;

a differential adder which sums the values of the negator and of the squared memory to produce a differential squared value;

a mean square register which stores a mean square value of the sum of the most recent N values of the squared sample means; and a mean square adder which sums the output of the mean square register and of the differential adder to produce an updated mean square value to be stored in said mean square value register.

2. A measuring circuit as claimed in claim 1 wherein the sampling frequency is the fifth harmonic of the fundamental frequency.

3. A measuring circuit as claimed in claim 1 wherein the sampling frequency is the fifth harmonic of the fundamental frequency.

4. A measuring circuit as claimed in claim 1 wherein the sampling frequency is 300 Hertz.

5. A measuring circuit for obtaining a fast mean square value of a power distribution line parameter comprising:

a sampling circuit, which samples the power parameter at a sampling frequency (FS) which is an odd (Nth) harmonic of the fundamental frequency (FF) of the power parameter, to provide sample values;

squaring means which produce a square sample value proportional to the squared value of a sample;

fast accumulator means which stores the values of the two most recent values of the squared sample values;

summing means which provides a fast mean square signal proportional to the sum of the two most recent values of the squared sample values stored in the accumulator means;

an analog to digital converter for digitizing the sample values and, wherein said squaring means is a squared memory which stores digitized values substantially equal to one/Nth the values of the square of the sample values likely to be encountered, said memory being selectively addressed by the digitized sample value to produce a squared sample value which is very nearly equal to one/Nth the value of the square of the sample value;

said accumulator means is a fast first in first out storage register which stores two squared sample values accepting a newest squared sample value at its input and preventing the oldest squared sample value at its output; and said summing means comprises, a negator accepting the oldest squared sample value from said first in first out storage register and negating the value;

a differential adder which sums the values of the negator and of the squared memory to produce a differential squared value;

a fast mean squared register which stores a fast mean square value of the sum of the two most recent N values of the squared sample means; and a fast mean square adder which sums the output of the fast mean square register and the differential adder to produce an updated fast mean square value to be stored in said fast mean square value register.

* * * * *